(12) United States Patent
Forbes et al.

(10) Patent No.: US 7,498,521 B2
(45) Date of Patent: Mar. 3, 2009

(54) METHOD AND APPARATUS FOR MARKING A PRINTED CIRCUIT BOARD

(75) Inventors: Brian S. Forbes, Portland, OR (US); William L. Sanderson, IV, Hillsboro, OR (US); Daniel J. Ragland, Aloha, OR (US); Tim Menard, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 629 days.

(21) Appl. No.: 11/170,823

(22) Filed: Jun. 30, 2005

(65) Prior Publication Data
US 2007/0002544 A1    Jan. 4, 2007

(51) Int. Cl.
*H05K 1/03* (2006.01)
*H05K 3/36* (2006.01)

(52) U.S. Cl. .......... 174/255; 29/830
(58) Field of Classification Search ........ 174/250, 174/255; 29/830
See application file for complete search history.

(56) References Cited

U.S. PATENT DOCUMENTS 6,008,578 A * 12/1999 Chen ............... 313/506
2003/0043120 A1 * 3/2003 Han ............... 345/168

* cited by examiner

*Primary Examiner*—Jeremy C Norris
(74) *Attorney, Agent, or Firm*—Buckley, Maschoff & Talwalkar LLC

(57) ABSTRACT

A method and apparatus include providing a printed circuit board (PCB) having at least one light permeable layer, at least one non-light permeable layer having at least one void therethrough that may be vertically aligned with the at least one light permeable layer, and a source of illumination to simultaneously illuminate through the void and the at least one light permeable layer.

28 Claims, 5 Drawing Sheets

METHOD AND APPARATUS FOR MARKING A PRINTED CIRCUIT BOARD

BACKGROUND OF THE INVENTION

A printed circuit board (PCB) may be labeled, for example, by spraying a silk screen ink onto a surface of the PCB. The ink may be applied to identify the PCB using text, numbers, or other printed symbols and indicia. However, the silk screen ink, like other surface marking methods, may be removed using a variety of mechanical and chemical methods and techniques, for example, chemical solvents to dissolve the ink or other marking.

Additionally, the ink printing and other types of markings on a PCB may not be easily read in the low light conditions that tend to exist inside of an electronic housing such as those that commonly contain PCBs. Thus, printed ink and other types of PCB surface markings may be inadequate at providing a method of identifying the PCB in an operational environment.

There is a general need for a method and system to mark and identifying PCBs.

DETAILED DESCRIPTION

The several embodiments described herein are solely for the purpose of illustration. Embodiments may include any currently or hereafter-known versions of the elements described herein. Therefore, persons skilled in the art will recognize from this description-that other embodiments may be practiced with various modifications and alterations.

Figure 1:
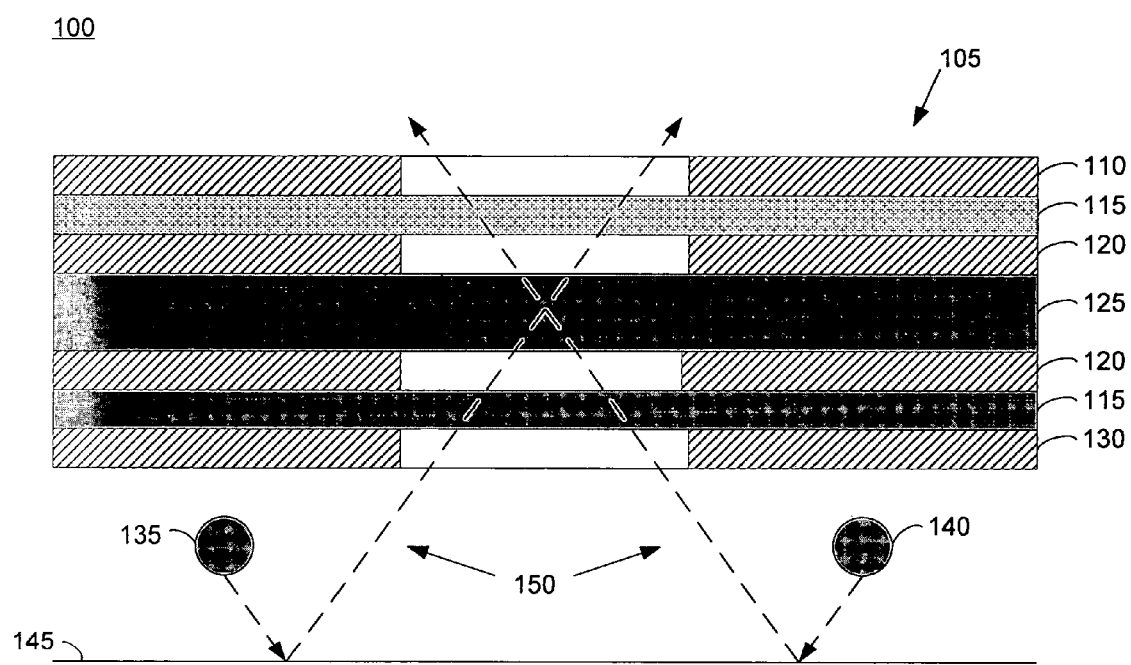
FIG. 1 is an exemplary schematic cross-section of an apparatus, in accordance with some embodiments herein.

FIG. 1 is an exemplary schematic cross-section of an apparatus 100, in accordance with some embodiments herein. Apparatus 100 includes, generally, a PCB 105 and a source of illumination 135, 140. The source of illumination in the depicted apparatus includes two point sources of illumination 135, 140. In some embodiments, the source of illumination may be generated from a single location (FIG. 4) or from multiple locations (FIG. 1).

PCB 105 may comprise a variety of components and composite materials. The materials and components forming PCB 105 may vary to include materials now known and that become known for the fabrication of PCBs, so long as the materials comprising PCB 105 are in accordance with the various embodiments hereof. PCB 105 may comprise a laminate of alternate layers of conductor and an insulator. The conductor may include, for example, copper or other metals. The insulator layers may include, for example, a layer of cured fiberglass-epoxy resin and a layer of an uncured fiberglass-epoxy resin. For example, PCB 105 includes a top light permeable resin layer 115 and a bottom light permeable resin layer 130. Top and bottom light permeable resin layers 115, 130 may comprise an uncured fiberglass-epoxy resin and are also referred to as prepreg. Top and bottom light permeable resin layers 115,130 may have a conductor layer 110 attached to at least one planar surface thereof. In some embodiments, top and bottom light permeable resin layers 115, 130 may have a conductor layer attached to both sides thereof.

PCB 105 also includes a core layer 125 between conductor layers 120. Core layer 125 may include a thin dielectric layer of cured fiberglass-epoxy resin that is separated from other layers (e.g. core layers and/or prepreg) by conductor layers 120.

In accordance herewith, core layer 125 and prepreg layers 115, 130 are light permeable. That is, core layer 125 and prepreg layers 115, 130 allow a percentage of light from a source on a first side thereof to illuminate (i.e., travel) therethrough.

In some embodiments herein, a void is provided in conductor layers 110, 120 of PCB 105. The void in the conductor layers are vertically aligned with light permeable layers 115, 125, 130. The void allows light to pass through conductor layers 110, 120. The void may be formed in conductor layers 110, 120 in any manner consistent with the materials comprising PCB 105 and the various embodiments herein, including known PCB fabrication techniques and methods.

In some embodiments herein, a void or multiple voids may be placed in and through a non-light permeable layer of material. The non-light permeable may include a dielectric, an insulator, a conductor, and conductor layers, for example, conductor layers 110, 120.

In some embodiments, a number of voids may be in conductor layers 110, 120. In some embodiments, at least some of the plurality of voids in the conductor layers 110, 120 may be interconnected. The plurality of interconnected voids may be connected in some patterned manner.

Sources of illumination 135, 140 are provided to illuminate through the light permeable prepreg 115, 130 and void provided in conductor layers 110, 120. Light rays 150 originating from sources of illumination 135, 140 may be reflected off of a reflective surface 145. Reflective surface 145 may include a mirror or other suitable reflective material or surface.

In some embodiments, reflective surface 145 may comprise an equipment housing or chassis or a reflective surface thereon. In some embodiments, a source of illumination may directly shine through PCB 105 in the area of the void through conductor layers 110, 120. In some embodiments, one, two, or more sources of illumination may be provided. In some embodiments, ambient light in a vicinity of a PCB, apparatus, and system, in accordance with some embodiments herein, may comprise the source of illumination.

As shown, light rays 150 are able to pass through PCB 105 in an area thereof where the void in conductor layers 110, 120 is vertically aligned with the light permeable layers 115, 125, 130. Rays of light cannot pass through PCB in areas other than the voided area since conductor layers 115, 125, 130 are not light permeable.

Figure 2:
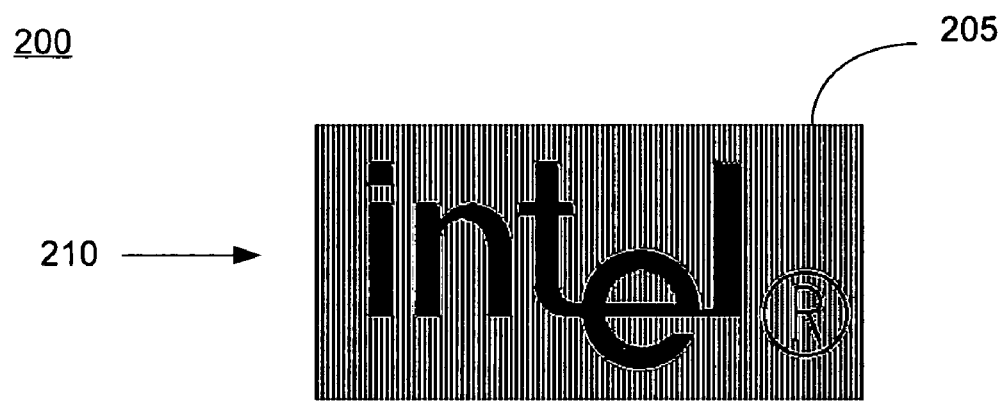
FIG. 2 is a top plan view of an apparatus, according to some embodiments herein.

In some embodiments, multiple voids may be provided through the conductor layers of a PCB. The multiple voids through the PCB conductors may be interconnected to form, for example, a word, company logo, a serial number, a part number, or other identifying indicia or mark. FIG. 2 is a top plan view of an apparatus 200. Apparatus 200 includes a PCB 205 with a text mark 210 formed therein in accordance with some embodiments herein. Text mark 210 spells "intel". As illustrated, text mark 210 also includes the registered trademark symbol, "®". It should be understood that these and other words, marks, symbols, designs, and marking may be provided on a PCB, in accordance with some embodiments herein.

Figure 3:
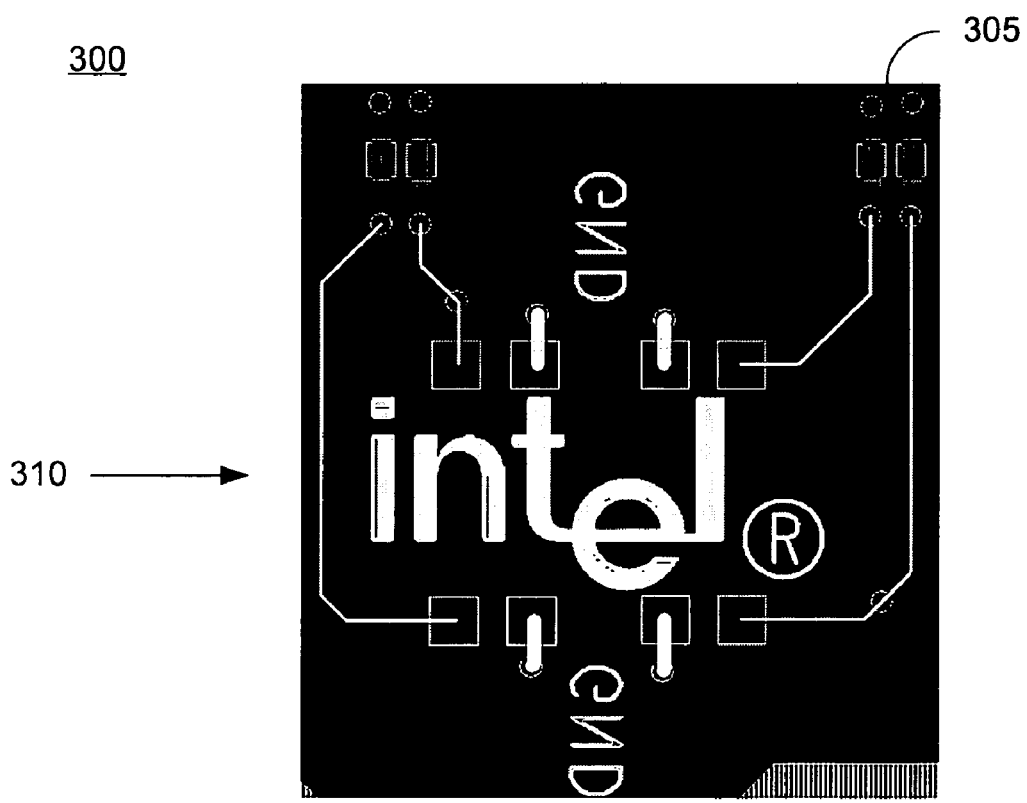
FIG. 3 is a top plan view of another apparatus, according to some embodiments herein.

FIG. 3 is an embodiment of an apparatus 300, in accordance with some embodiments herein. Apparatus 300 includes a PCB 305 having a mark "intel®" formed therein, in accordance with some embodiments herein. Apparatus 300 also has a number of components attached to PCB 305. The components attached to PCB may include electrical and electronic components such as, for example, resistors, integrated circuits, device leads, and other devices.

Figure 4:
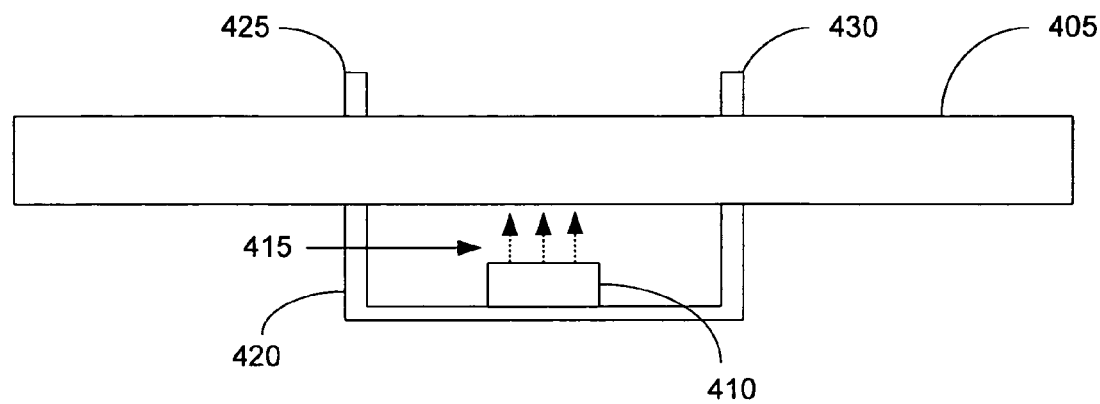
FIG. 4 is a side elevation view of an exemplary apparatus, in accordance with some embodiments herein.

FIG. 4 is a side elevation view of an exemplary apparatus 400, in accordance with some embodiments herein. Apparatus 400 includes a PCB 405 (e.g., a multilayer PCB) and a source of illumination 410. Illumination source 410 may be a LED, a fiber-optic light source, or other light source. Illumination source 410 is supported in proximity to PCB by support structure 420. Support structure 420 may form a part of illumination source 410 (e.g., leads) or be a separate structure from illumination source 410.

In some embodiments, support structure 420 may provide a mechanism for mounting illumination source 410 in proximity to one side of PCB 405. In some embodiments, support structure 420 may provide an electrical connection between illumination source 410 and a power source for powering the illumination source. The power supply (not shown) may include a dedicated or shared power supply, battery, supply line, etc. Stake pins 425 and 430 may connect to different electrical potentials (e.g., a positive supply, a negative supply, and ground potential) for providing power to illumination source 410.

In some embodiments, support structure 420 may have an electrical conductor on or therein to connect illumination source 410 to a power supply. The electrical conductor may include a conductive trace, a wire, or other electrical connection device or method.

Light rays 415 are generated by illumination device 410 and are directed up towards an underside of PCB 405. A mark formed in PCB according to some embodiments herein allows light rays 415 to pass through PCB 405 in an area occupied by light permeable layers (e.g. core layers and prepreg layers) and voids through conductor layers. Accordingly, viewing PCB from a top side thereof provides a mark (e.g., word, logo, design, number, etc.) that appears to be illuminated. The appearance of being illuminated may be particularly enhanced in an instance the surrounding top layer of PCB is dark in color and/or the PCB is located in a relatively dark environment. Consistent in some embodiments hereof is an illumination source that shines from one side of a PCB, through both the PCB light permeable layers (e.g. core layers and prepreg layers) and the voids in the conductor layers, and out of an opposing side of the PCB. The light simultaneously shines through the light permeable layers and the voids in the conductor layers.

Figure 5:
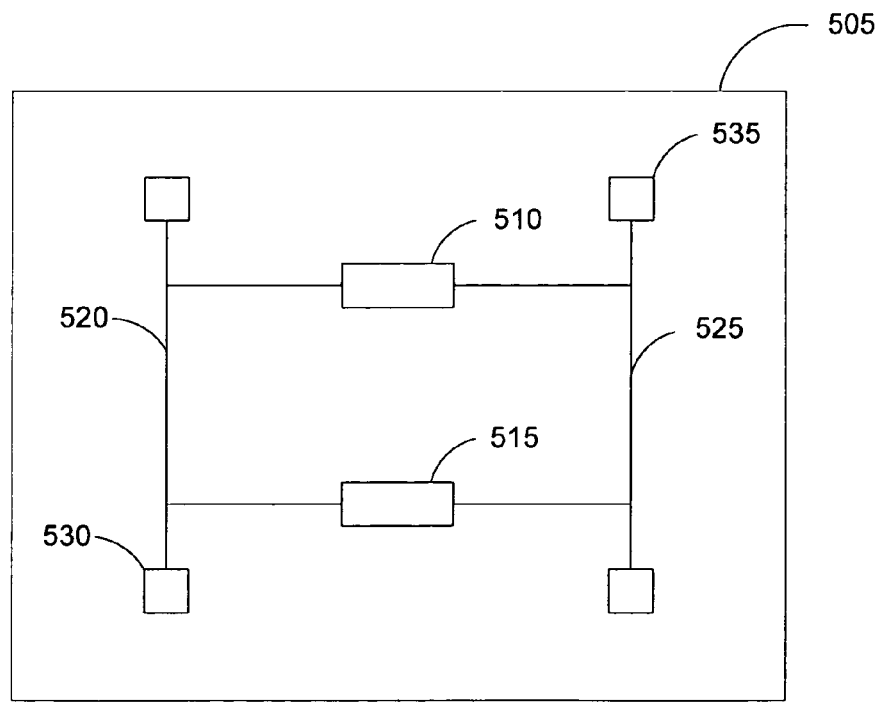
FIG. 5 is an exemplary illustration of an apparatus, in accordance with some embodiments herein.

Referring to FIG. 5, there is illustrated an exemplary apparatus 500, in accordance with some embodiments herein. Apparatus 500 includes a PCB 505 having LEDs 510 and 515 connected thereto. LEDs 510 and 515 are powered from a power routing trace 525 and a ground routing trace 520. Stake pin holders 530 and 535 may be used to anchor PCB to another device, housing, PCB, etc. It should be appreciated that the particular mounting of an illumination source may be varied.

Figure 6:
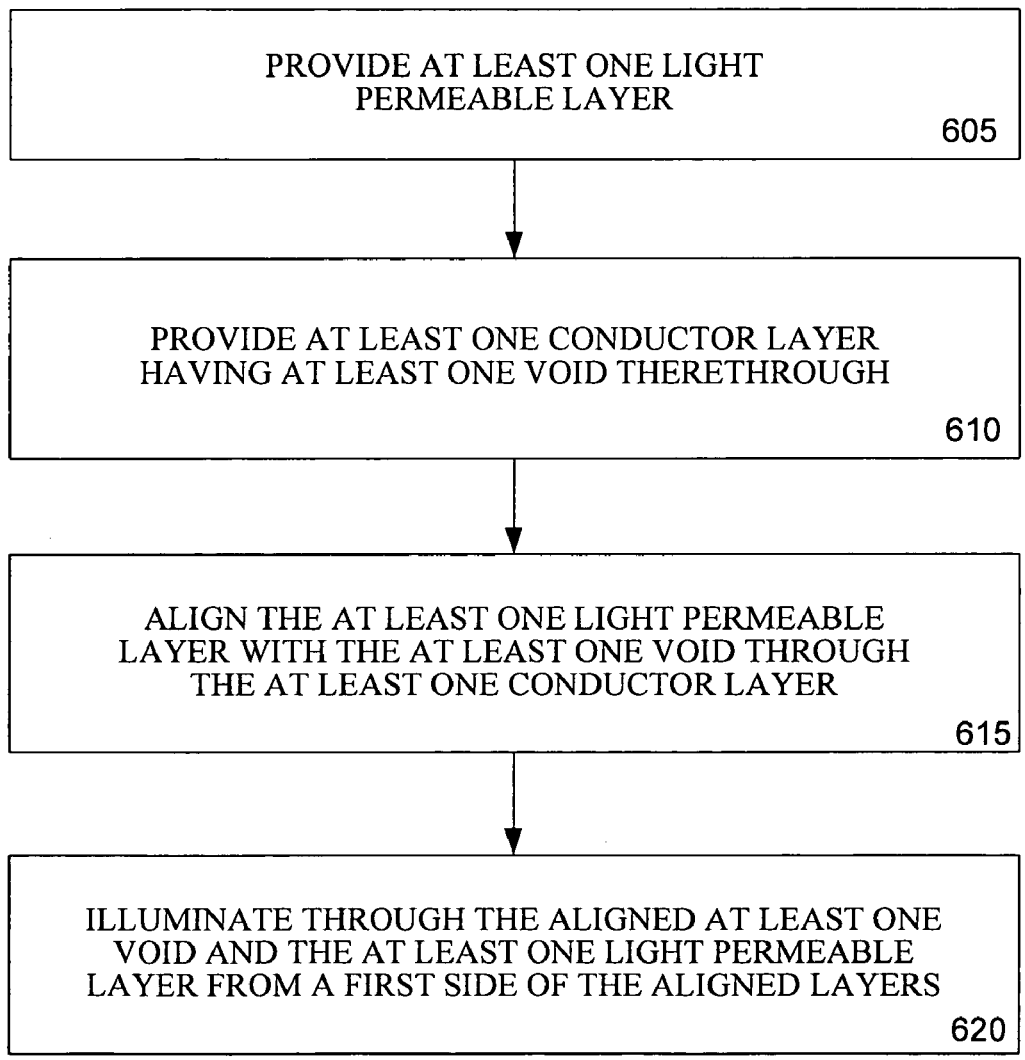
FIG. 6 is an exemplary flow diagram of a method, in accordance with some embodiments herein.

FIG. 6 is an exemplary method 600, in accordance with some embodiments herein. At operation 605, at least one light permeable PCB layer is provided. The light permeable layer may be any light permeable material now known or becomes known in the future that is consistent with the embodiments herein and compatible with PCB construction and fabrication techniques and processes. In some embodiments, the light permeable layers may comprise core layers and prepreg layers.

At operation 610, at least one conductor layer having a void therethrough is provided. The void may be sufficiently sized to allow an appreciable (i.e., discernable, humanly detectable) amount of light therethrough. In further accordance with some embodiments herein, the at least one light permeable layer is aligned with the at least one void in the at least one conductor layer at an operation 615. In some embodiments, the aligning occurs along a vertical axis.

At operation 620, light from a source of illumination simultaneously shines through the aligned at least one void and at least one light permeable layer. The light, at least an appreciable (i.e., visually perceptible) percentage thereof, passes through the at least one void and the at least one light permeable layer of the PCB.

Figure 7:
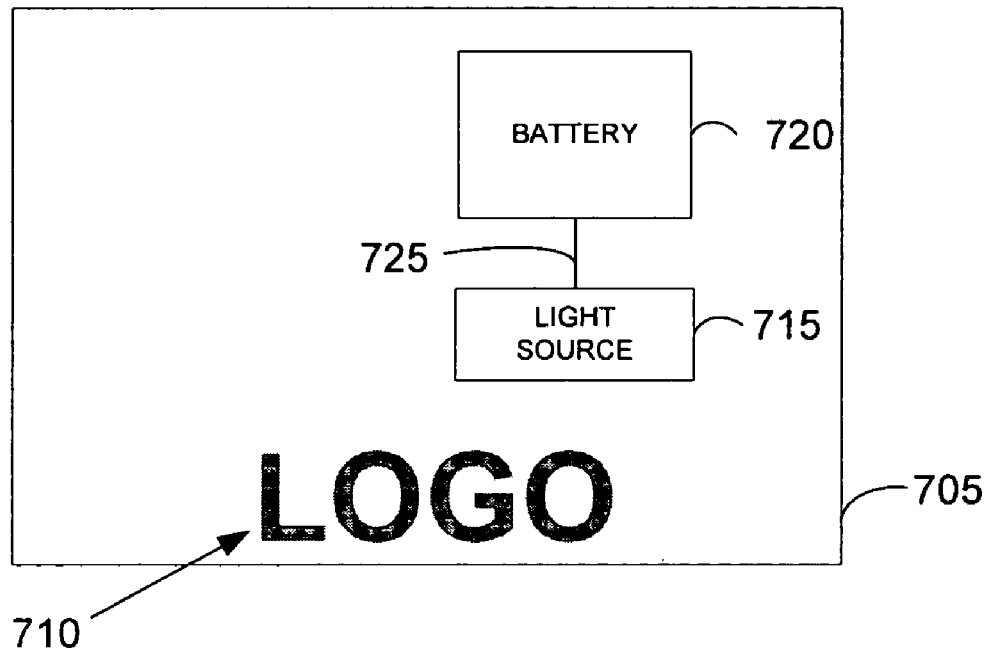
FIG. 7 is a block diagram of an exemplary system in accordance with some embodiments herein.

FIG. 7 is a block diagram of an exemplary system 700, in accordance with some embodiments herein. System 700 includes a PCB 705. PCB 705 may include at least one light permeable layer and at least one conductor layer, the at least one conductor layer having at least one void therethrough that is vertically aligned with the at least one light permeable layer. The aligned at least one void and the at least one light permeable layer of PCB 705 cooperate to provide mark 710. As shown, mark 710 provides the word "LOGO". PCB 705 also includes a light source 715 (i.e., a source of illumination) to simultaneously illuminate through the at least one void and the at least one light permeable layer. Light source 715 is powered by some type of power supply. Battery 720 is provided in system 700 to provide power to, at least, light source 715.

Mark 710 may be formed in the shape or configuration of a word, a logo, a serial number, a part number, and other identifying indicia in the at least one conductor layer of PCB 705.

The foregoing disclosure has been described with reference to specific exemplary embodiments thereof. It will, however, be evident that various modifications and changes may be made thereto without departing from the broader spirit and scope set forth in the appended claims.

What is claimed is:

1. A printed circuit board (PCB), comprising:
   at least one light permeable layer;
   at least one non-light permeable layer having at least one void therein, wherein the at least one void is vertically aligned with the at least one light permeable layer and the non-light permeable layer is a conductor; and
   a source of illumination to simultaneously illuminate through the void and the at least one light permeable layer.

2. The PCB of claim 1, wherein the light permeable layer is at least one of a PCB core layer and a PCB prepreg layer.

3. The PCB of claim 1, wherein the at least one void comprises a plurality of voids through the at least one non-light permeable layer that are vertically aligned with the at least one light permeable layer.

4. The PCB of claim 1, wherein the source of illumination includes at least one of a light emitting diode and ambient light.

5. The PCB of claim 1, wherein the source of illumination receives electrical power from a power source connected to the PCB.

6. The PCB of claim 1, wherein the at least one void forms a word, a logo, a serial number, a part number, and other identifying indicia in the at least one non-light permeable layer.

7. A printed circuit board (PCB), comprising:
at least one light permeable layer;
at least one non-light Permeable layer having at least one void therein, wherein the at least one void is vertically aligned with the at least one light permeable layer;
a source of illumination to simultaneously illuminate through the void and the at least one light permeable layer; and
multiple non-light permeable layers alternately separated by a layer of the at least one light permeable layer.

8. The PCB of claim 7, wherein the light permeable layer is at least one of a PCB core layer and a PCB prepreg layer.

9. The PCB of claim 7, wherein the at least one void comprises a plurality of voids through the at least one non-light permeable layer that are vertically aligned with the at least one light permeable layer.

10. The PCB of claim 7, wherein the source of illumination includes at least one of a light emitting diode and ambient light.

11. The PCB of claim 7, wherein the source of illumination receives electrical power from a power source connected to the PCB.

12. The PCB of claim 7, wherein the at least one void forms a word, a logo, a serial number, a part number, and other identifying indicia in the at least one non-light permeable layer.

13. A printed circuit board (PCB), comprising:
at least one light permeable layer; and
at least one non-light permeable layer, the at least one non-light permeable layer having at least one void therethrough vertically aligned with the at least one light permeable layer to allow light to simultaneously illuminate through the void and the at least one light permeable layer, wherein the non-light permeable layer is a conductor.

14. The PCB of claim 13, wherein the light permeable layer is at least one of a PCB core layer and a PCB prepreg layer.

15. The PCB of claim 13, wherein the at least one void comprises a plurality of voids through the at least one non-light permeable layer that are vertically aligned with the at least one light permeable layer.

16. The PCB of claim 13, wherein the at least one void forms a word, a logo, a serial number, a part number, and other identifying indicia in the at least one non-light permeable layer.

17. A printed circuit board (PCB), comprising:
at least one light permeable layer; and
at least one non-light permeable layer, the at least one non-light permeable layer having at least one void therethrough vertically aligned with the at least one light permeable layer to allow light to simultaneously illuminate through the void and the at least one light permeable layer; and
multiple non-light permeable layers alternately separated by a layer of the at least one light permeable layer.

18. The PCB of claim 17, wherein the light permeable layer is at least one of a PCB core layer and a PCB prepreg layer.

19. The PCB of claim 17, wherein the at least one void comprises a plurality of voids through the at least one non-light permeable layer that are vertically aligned with the at least one light permeable layer.

20. The PCB of claim 17, wherein the at least one void forms a word, a logo, a serial number, a part number, and other identifying indicia in the at least one non-light permeable layer.

21. A method comprising:
providing at least one light permeable layer;
providing at least one non-light permeable layer having at least one void therethrough, wherein the non-light permeable layer is a conductor; and
vertically aligning the at least one void with the at least one light permeable layer, wherein light can simultaneously pass through the at least one void and the at least one light permeable layer.

22. The method of claim 21, wherein the light permeable layer is at least one of a PCB core layer and a PCB prepreg layer.

23. The method of claim 21, wherein the at least one void comprises a plurality of voids through the at least one non-light permeable layer that are vertically aligned with the at least one light permeable layer.

24. The method of claim 21, further comprising providing a source of illumination to simultaneously illuminate through the at least one void and the at least one light permeable layer.

25. A method comprising:
providing at least one light permeable layer;
providing at least one non-light permeable layer having at least one void therethrough;
vertically aligning the at least one void with the at least one light permeable layer, wherein light can simultaneously pass through the at least one void and the at least one light permeable layer;
providing multiple non-light permeable layers; and
alternately separating the multiple non-light permeable layers with a layer of the at least one light permeable layer.

26. The method of claim 25, wherein the light permeable layer is at least one of a PCB core layer and a PCB prepreg layer.

27. The method of claim 25, wherein the at least one void comprises a plurality of voids through the at least one non-light permeable layer that are vertically aligned with the at least one light permeable layer.

28. The method of claim 25, further comprising providing a source of illumination to simultaneously illuminate through the at least one void and the at least one light permeable layer.

\* \* \* \* \*